(12) United States Patent
Hida

(10) Patent No.: US 11,148,420 B2
(45) Date of Patent: Oct. 19, 2021

(54) LIQUID DISCHARGE HEAD AND LIQUID DISCHARGE APPARATUS

(71) Applicant: TOSHIBA TEC KABUSHIKI KAISHA, Tokyo (JP)

(72) Inventor: Shinichiro Hida, Numazu Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 73 days.

(21) Appl. No.: 16/570,003

(22) Filed: Sep. 13, 2019

(65) Prior Publication Data

US 2020/0164648 A1 May 28, 2020

(30) Foreign Application Priority Data

Nov. 22, 2018 (JP) .............................. JP2018-219592

(51) Int. Cl.
*B41J 2/14* (2006.01)
*H01L 41/08* (2006.01)

(52) U.S. Cl.
CPC ...... *B41J 2/14233* (2013.01); *H01L 41/0805* (2013.01); *B41J 2002/14258* (2013.01); *B41J 2002/14266* (2013.01); *B41J 2002/14491* (2013.01)

(58) Field of Classification Search
CPC .......... B41J 2002/14362; B41J 2/14233; B41J 2/1623
See application file for complete search history.

(56) References Cited

U.S. PATENT DOCUMENTS

| 6,568,794 | B2* | 5/2003 | Yamanaka | B41J 2/14314 347/20 |
| 7,192,132 | B2* | 3/2007 | Suzuki | B41J 2/14 347/94 |
| 7,484,828 | B2* | 2/2009 | Owaki | B41J 2/14145 347/44 |
| 8,047,630 | B2* | 11/2011 | Kakuda | B41J 2/14274 347/45 |
| 8,668,306 | B2* | 3/2014 | Eguchi | B41J 2/16535 347/33 |
| 9,022,521 | B2* | 5/2015 | Sasaki | B41J 2/1623 347/20 |
| 2003/0038868 | A1* | 2/2003 | Arai | B41J 2/17513 347/94 |
| 2009/0102907 | A1* | 4/2009 | Yamanaka | B41J 2/14274 347/94 |
| 2018/0333955 | A1* | 11/2018 | Oikawa | B41J 2/04541 |

FOREIGN PATENT DOCUMENTS

JP 2010-260311 A 11/2010

* cited by examiner

*Primary Examiner* — John Zimmermann
(74) *Attorney, Agent, or Firm* — Kim & Stewart LLP

(57) ABSTRACT

A liquid discharge head includes a drive base, a flexible wiring substrate, and a mask plate. The drive base includes an array of nozzles on a surface of the drive base, a plurality of actuators corresponding to the array of nozzles, and a plurality of electrodes on the surface of the drive base and electrically connected to the plurality of actuators. The flexible wiring substrate is electrically connected to the plurality of electrodes. The mask plate covers a portion of the surface of the drive base, the plurality of electrodes, and an end portion of the flexible wiring substrate. The mask plate includes a recess portion facing the drive base.

18 Claims, 7 Drawing Sheets

LIQUID DISCHARGE HEAD AND LIQUID DISCHARGE APPARATUS

CROSS-REFERENCE TO RELATED APPLICATION

This application is based upon and claims the benefit of priority from Japanese Patent Application No. 2018-219592, filed on Nov. 22, 2018 the entire contents of which are incorporated herein by reference.

FIELD

Embodiments described herein relate generally to a liquid discharge head and a liquid discharge apparatus.

BACKGROUND

A liquid discharge head having an electrode on a discharge surface of a drive base with a nozzle is known. An electrode formed on the discharge surface can be connected to a "chip on film" (COF) which is a drive IC mounted on an anisotropic conductive film (ACF). In such a liquid discharge head, a mask plate may be provided to cover the electrode to prevent liquid from adhering to the electrode near the nozzles. The mask plate has a predetermined thickness and is adhered to the discharge surface with, for example, an adhesive layer. Since the surface of the mask plate protrudes from the discharge surface in the discharge direction, a step change occurs in the surface on the discharge side of the liquid discharge head. Due to this step change, cleaning of the discharge surface during maintenance processes may be ineffective because contact between a wiping member and the discharge surface may not be reliably achieved.

DETAILED DESCRIPTION

Embodiments provide a liquid discharge head and a liquid discharge apparatus which facilitate cleaning.

In general, according to an embodiment, a liquid discharge head includes a drive base, a flexible wiring substrate, and a mask plate. The drive base includes an array of nozzles on a surface of the drive base, a plurality of actuators corresponding to the array of nozzles, and a plurality of electrodes on the surface of the drive base and electrically connected to the plurality of actuators. The flexible wiring substrate is electrically connected to the plurality of electrodes. The mask plate covers a portion of the surface of the drive base, the plurality of electrodes and an end portion of the flexible wiring substrate connected to the plurality of electrodes. The mask plate includes a recess portion facing the drive base.

Figure 1:
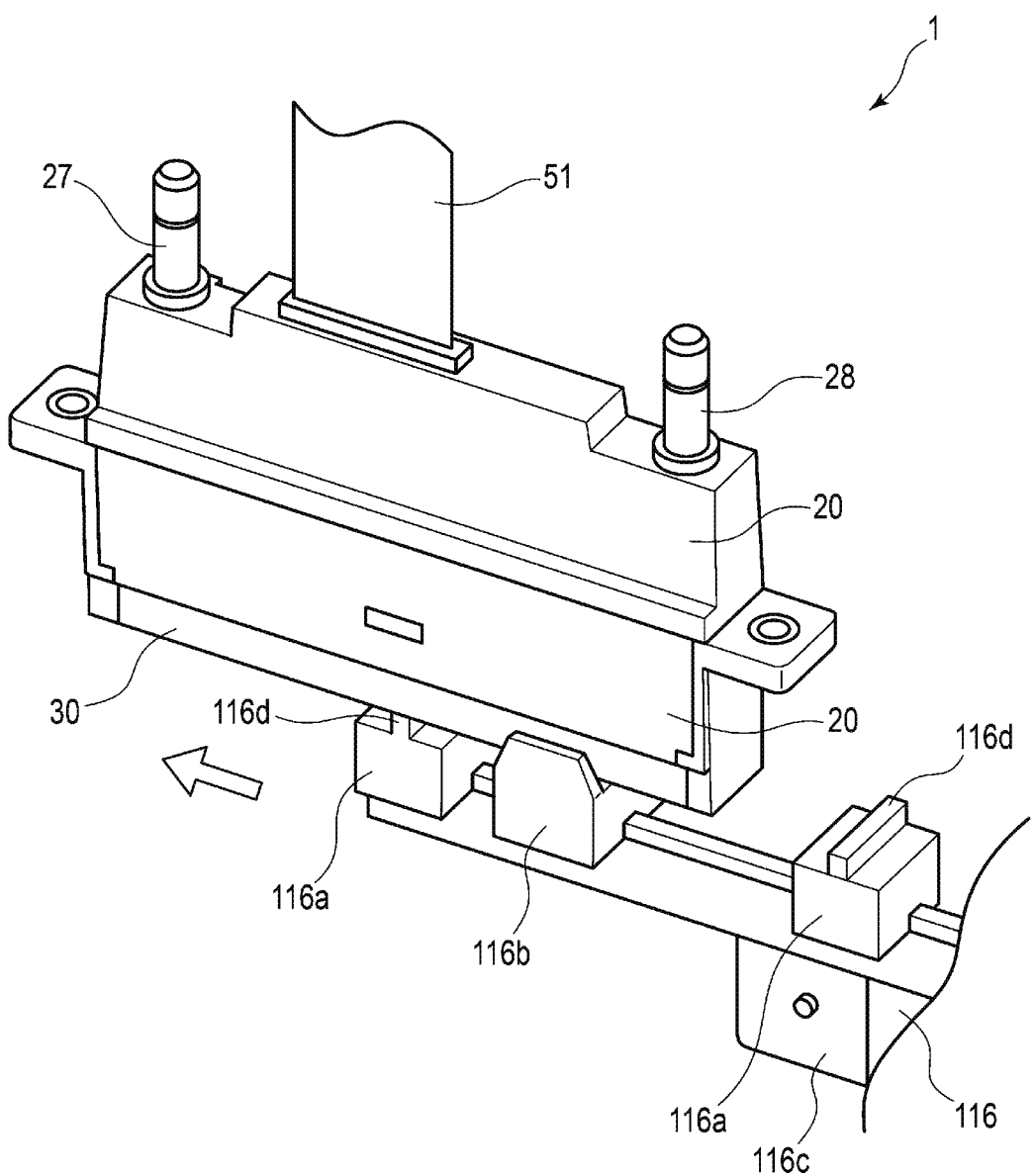
FIG. 1 illustrates a perspective view of an ink jet head according to an embodiment.
Figure 2:
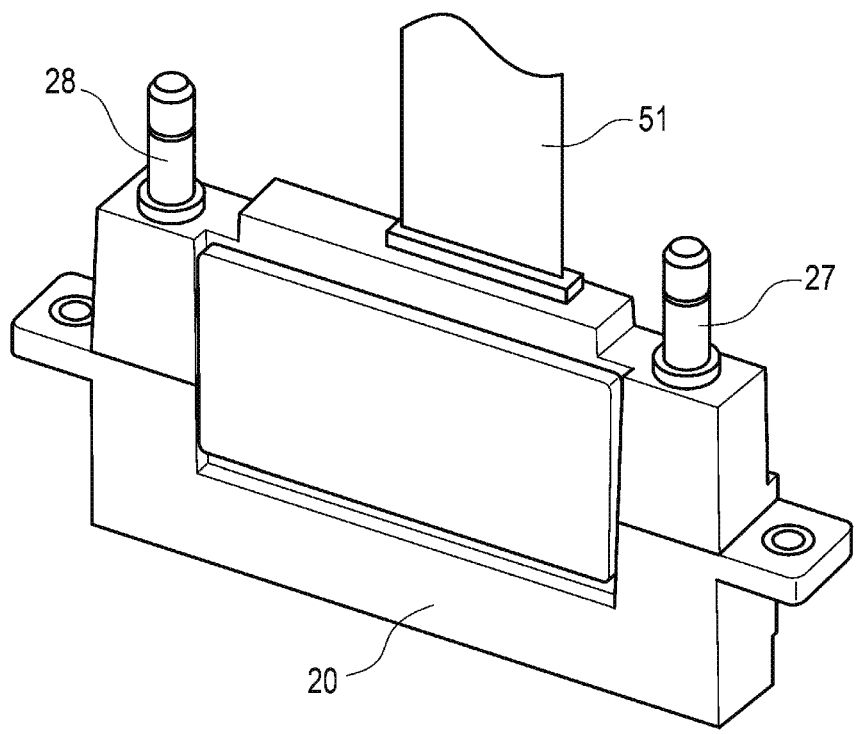
FIG. 2 illustrates another perspective view of the ink jet head.
Figure 3:
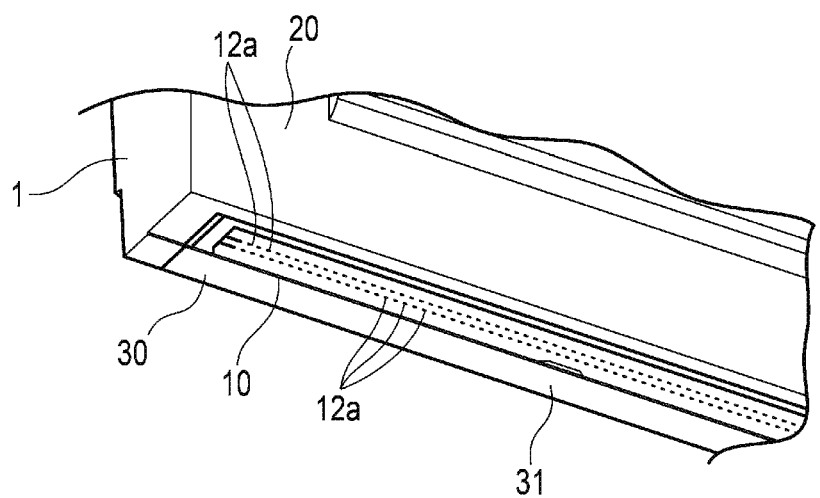
FIG. 3 illustrates a perspective view of a part of the ink jet head.
Figure 4:
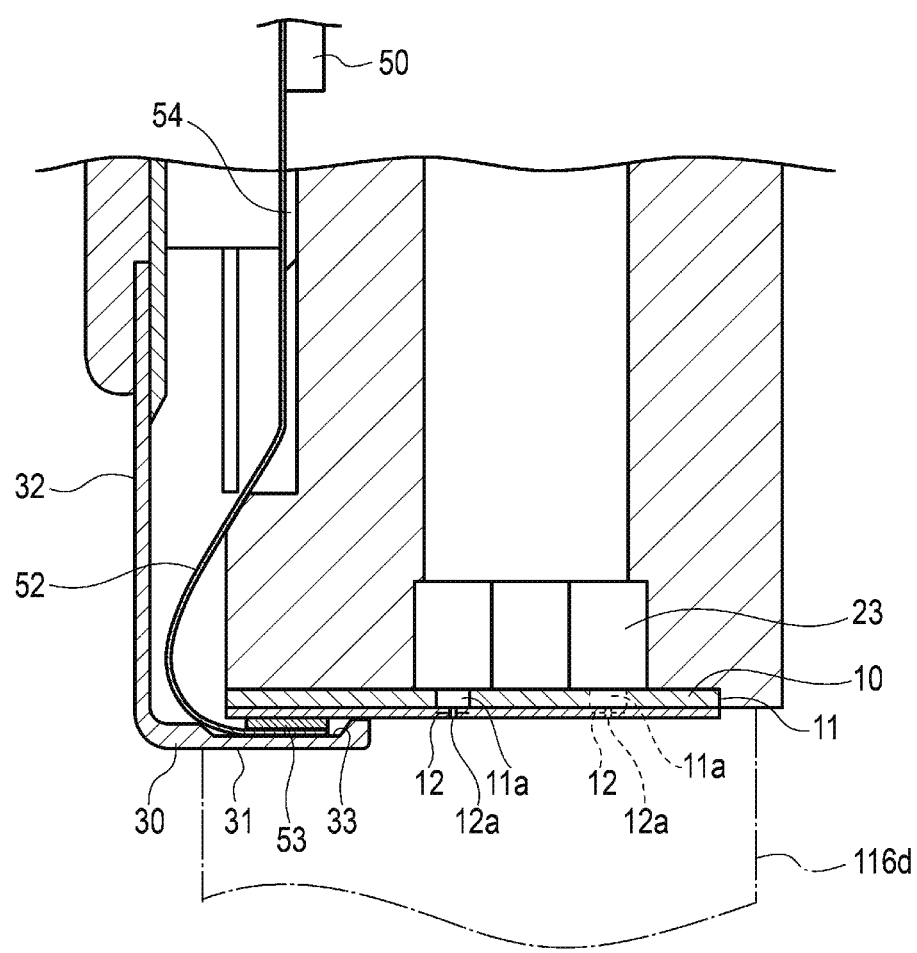
FIG. 4 illustrates a cross-sectional view of a part of the ink jet head.
Figure 5:
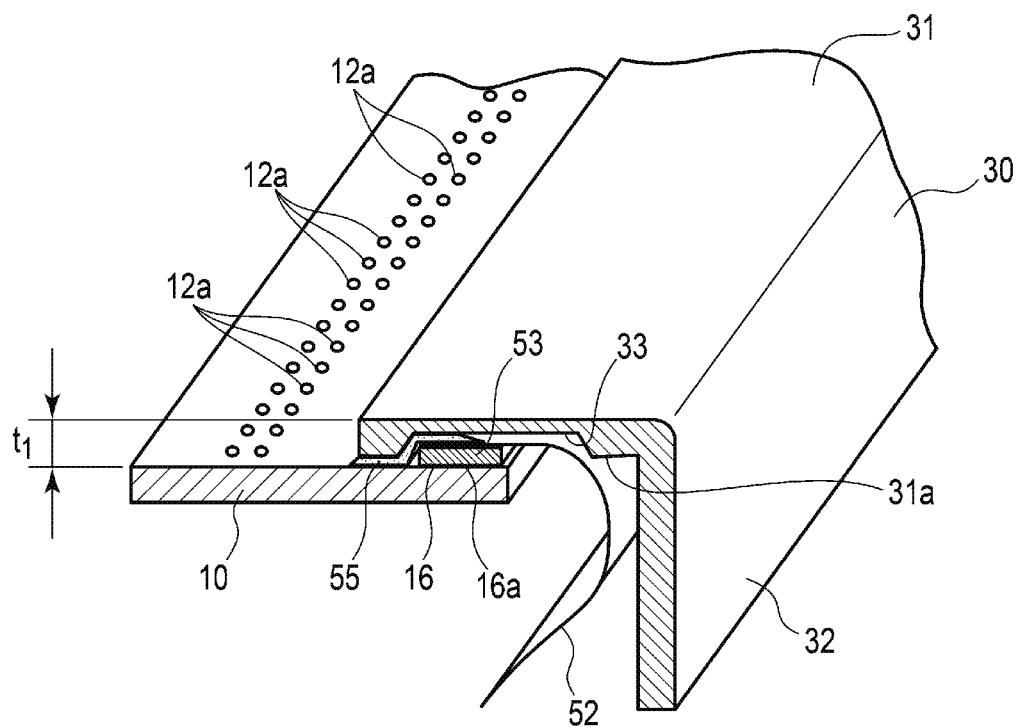
FIG. 5 illustrates a cross-sectional perspective view of a part of the ink jet head in an enlarged manner.
Figure 6:
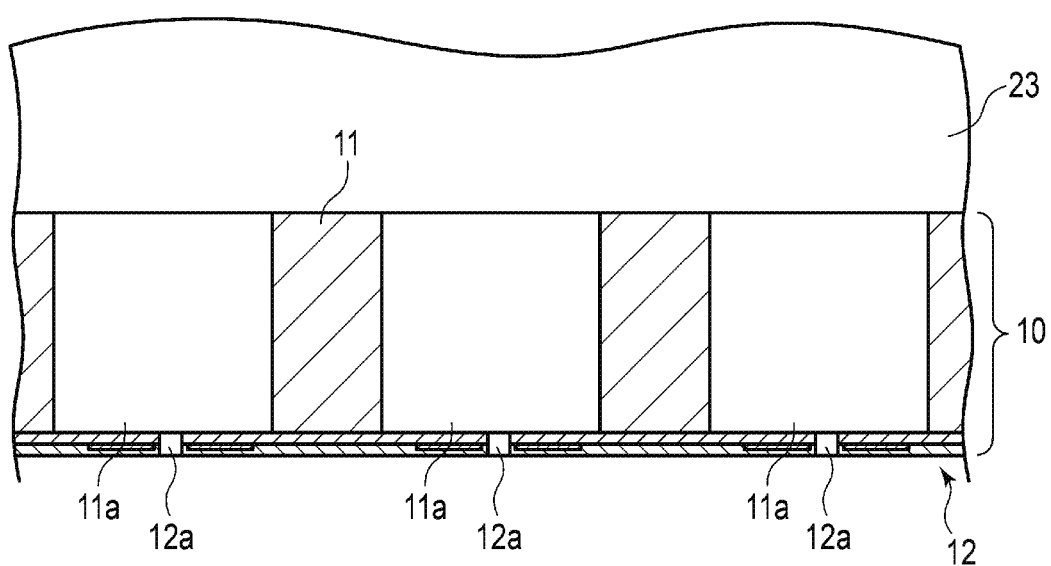
FIG. 6 illustrates a cross-sectional view of a part of a drive base of the ink jet head.
Figure 7:
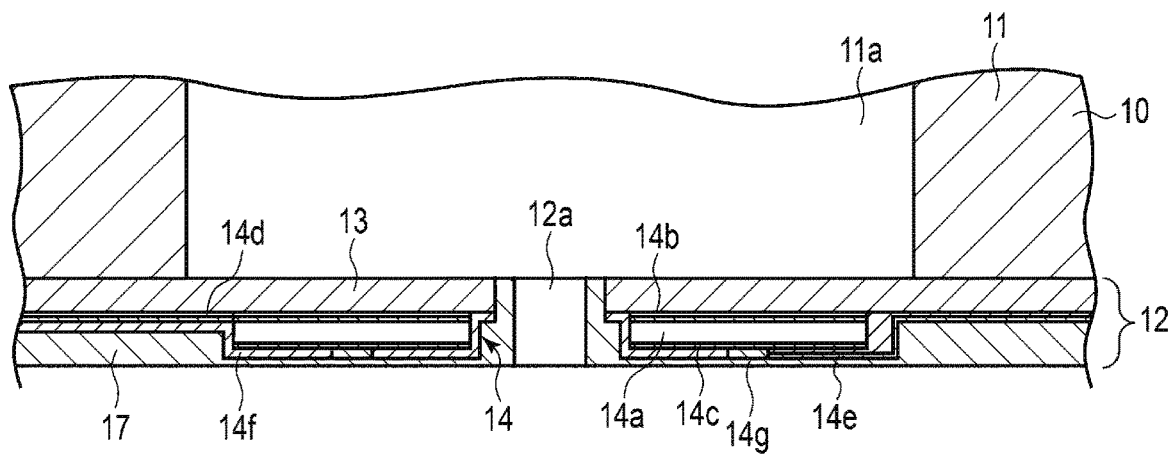
FIG. 7 illustrates a cross-sectional view of a part of a configuration of the drive base.
Figure 8:
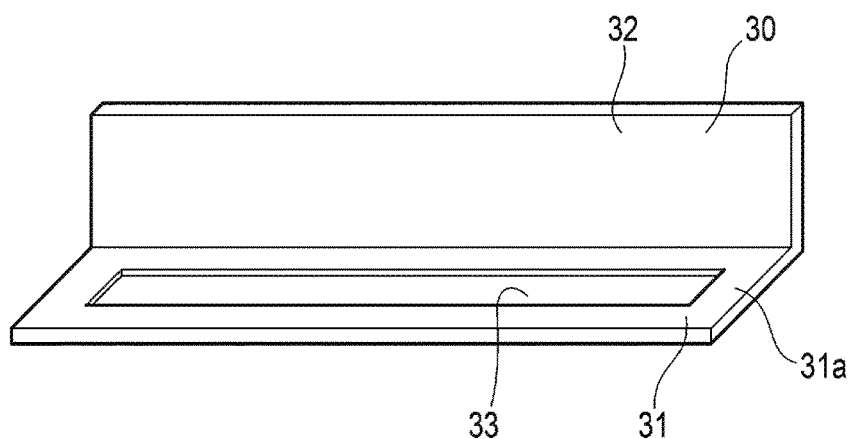
FIG. 8 illustrates a perspective view of a mask plate of the ink jet head.
Figure 9:
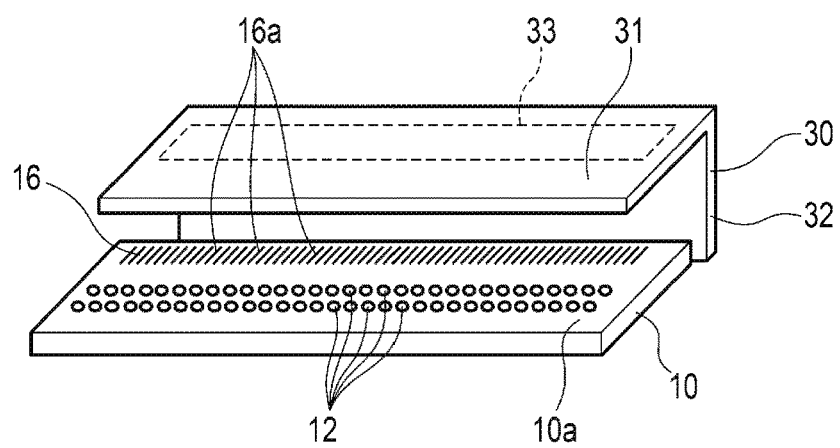
FIG. 9 illustrates an exploded perspective view of the mask plate and the drive base of the ink jet head.

Hereinafter, an ink jet head 1 and an ink jet apparatus 100 according to a first embodiment will be described as examples of a liquid discharge head and a liquid discharge apparatus with reference to FIGS. 1 to 10. FIGS. 1 and 2 illustrate perspective views of an ink jet head 1 according to a first embodiment. FIGS. 3 and 4 illustrate a perspective view and a cross-sectional view of a part of the ink jet head 1, respectively. FIG. 5 illustrates a cross-sectional perspective view of a part of the ink jet head 1 in an enlarged manner. FIGS. 6 and 7 illustrate cross-sectional views of a part of a drive base. FIG. 8 illustrates a perspective view of a mask plate 30. FIG. 9 illustrates an exploded perspective view of a part of the ink jet head 1, including the mask plate 30 and the drive base 10.

The ink jet head 1 illustrated in FIGS. 1 to 10 is, for example, a vent-mode MEMS-type ink jet head. For example, the ink jet head 1 is disposed in a liquid discharge apparatus such as an ink jet apparatus 100 illustrated in FIG. 10 in facing downward. The ink jet head 1 forms a desired image with discharged ink on a recording medium (such a sheet of paper or the like) arranged to face the ink jet head.

The ink jet head is not limited to a vent-mode MEMS-type ink jet head, and may be a share-mode shared-wall-type ink jet head.

As illustrated in FIGS. 1 to 9, the ink jet head 1 includes a drive base 10 including a plurality of nozzles 12a, a flow path base 20 for forming a liquid flow path, and a mask plate 30 for protecting a discharge surface 10a of the drive base 10 on the discharge side.

The drive base 10 is, for example, a MEMS chip configured as a rectangular plate-like shape with a piezoelectric vibration plate 12 in which the plurality of nozzles 12a communicating with a plurality of pressure chambers 11a is integrally formed with base layer 11 that includes the plurality of pressure chambers 11a.

The base layer 11 is formed of, for example, a single crystal silicon wafer, and the plurality of pressure chambers 11a are formed therein. Each pressure chamber 11a is, for example, a cylindrical space that can be filled with ink. The pressure chambers 11a are separated from one another.

The piezoelectric vibration plate 12 includes a vibration plate 13, an actuator 14, a mounting part 16, and a protective layer 17. In the piezoelectric vibration plate 12, the nozzles 12a are formed as through holes extending through the thickness of piezoelectric vibration plate 12. For example, in the present embodiment, two nozzle rows of aligned nozzles 12a are formed along a first direction. The nozzles 12a may be arranged in a row direction and a column direction, and the nozzles 12a may be arranged so that nozzles 12a of adjacent rows do not overlap along the column direction. The number of nozzle rows is not limited to 2 and may be 8, for example.

The vibration plate 13 is a layer formed on the base layer 11 and is formed of, for example, a SiO$_2$ film (silicon dioxide film).

The actuator 14 includes a piezoelectric body 14a and a pair of electrodes 14b and 14c sandwiching the piezoelectric body 14a.

The piezoelectric body 14a is formed of, for example, a piezoelectric ceramic material such as PZT (lead zirconate titanate). For example, the piezoelectric body 14a is formed inside the drive base 10 and is patterned in a circular shape surrounding the periphery of the nozzle 12a.

The first electrode 14b is one of two electrodes connected to the piezoelectric body 14a, and is formed on the pressure chamber 11a side of the piezoelectric body 14a. The first electrode 14b is connected to an individual wiring 14d.

The second electrode 14c is the other of two electrodes connected to the piezoelectric body 14a, and is formed on the discharge surface side of the piezoelectric body 14a. The second electrode 14c is connected to a common wiring 14e.

The individual wiring 14d and the common wiring 14e are wirings formed in a predetermined pattern, and are formed to reach the mounting part 16 or electrically connected to the mounting part 16. At the boundary between the protective layer 17 and the vibration plate 13, an insulating layer 14f that prevents short circuiting between the individual wiring 14d and the common wiring 14e is provided. A contact hole 14g is formed in the insulating layer 14f, and the second electrode 14c and the common wiring 14e are electrically connected by the contact hole 14g.

The actuator 14 is electrically connected to a drive IC 54 through the wiring pattern of the mounting part 16, an anisotropic conductive film (ACF) 53, and a COF 52.

The mounting part 16 includes, for example, an electrode 16a. The mounting part 16 is formed, for example, on the discharge surface 10a and on the side portion of the nozzle row. The electrode 16a of the mounting part 16 is connected to the individual wiring 14d and the common wiring 14e, and is also connected to the COF 52 through the ACF 53.

The flow path base 20 is assembled on the side opposite to the ink discharge side of the drive base 10 and is joined to the drive base 10. The flow path base 20 is a manifold which is formed in a rectangular shape, forms an outer shell of the ink jet head 1, and includes a predetermined ink flow path inside.

The ink flow path includes a common chamber 23 communicating with the plurality of pressure chambers 11a. A supply pipe 27 and a recovery pipe 28 are connected to end portions of the flow path base 20 opposite to the drive base 10 and provide flow paths to/from the common chamber 23.

The supply pipe 27 is a tube forming a flow path on the upstream side of the ink flow path. The recovery pipe 28 is a tube forming a flow path on the downstream side of the ink flow path.

As illustrated in FIGS. 2 to 5, the mask plate 30 constitutes a part of the outer contour of the ink jet head 1. The mask plate 30 is formed of a metal such as stainless steel (SUS) bent to have an L-shaped cross section, for example. Here, the mask plate 30 integrally includes a top plate portion 31, which covers a predetermined region of the discharge surface 10a, and a side plate portion 32, which is disposed on the outer periphery of the drive base 10.

A recess portion 33 having a predetermined depth is formed on an inner surface 31a of the top plate portion 31 facing the drive base 10. For example, the depth of the recess portion 33 is less than 4/5 of the plate thickness of the mask plate 30. In the present embodiment, the thickness of the mask plate 30 is 0.1 mm, and the depth of the recess portion 33 is 0.05 to 0.08 mm. For example, the mask plate 30 is produced by bending a metal plate or sheet in an L shape after the trench for the recess portion 33 has already been formed in the unbent plate/sheet by etching or the like.

The COF 52 is a film-like wiring substrate (e.g., flexible wiring substrate) on which a component such as the drive IC 54 is mounted. One end side of the COF 52 is connected to the electrode 16a of the mounting part 16 through the ACF 53. The other end of the COF 52 is connected to a circuit board 50 on which various electronic components are mounted. The circuit board 50 can be electrically connected to an external electronic device by, for example, a flexible cable 51.

The ACF 53 is formed of an anisotropic conductive material, and is interposed, for example, between the electrode 16a and the COF 52 to mechanically join and electrically connect the electrode 16a and the COF 52.

The drive IC 54 is connected to the mounting component and the wiring pattern on the circuit board 50 through the wiring pattern of the COF 52. The drive IC 54 is electrically connected to the actuator 14 in the pressure chamber 11a through the wiring pattern of the COF 52 and the electrode 16a of the mounting part 16.

An adhesive layer 55 is formed of an adhesive material such as epoxy. The adhesive layer 55 is disposed between the COF 52 and the mask plate 30 as well as between the discharge surface 10a and the mask plate 30, and bonds the mask plate 30 to the COF 52 and the discharge surface 10a. The adhesive layer 55 is partially accommodated in the recess portion 33 of the mask plate 30.

That is, the discharge surface 10a, the electrode 16a, the COF 52, and the mask plate 30 are joined by press-bonding these components in a lamination direction passing through the ACF 53.

In the ink jet head 1 configured as described above, the actuator 14 is deformed by applying a drive voltage from the drive IC 54, and the volume of the pressure chamber 11a is increased or decreased to discharge liquid droplets from the nozzle 12a facing the pressure chamber 11a.

Figure 10:
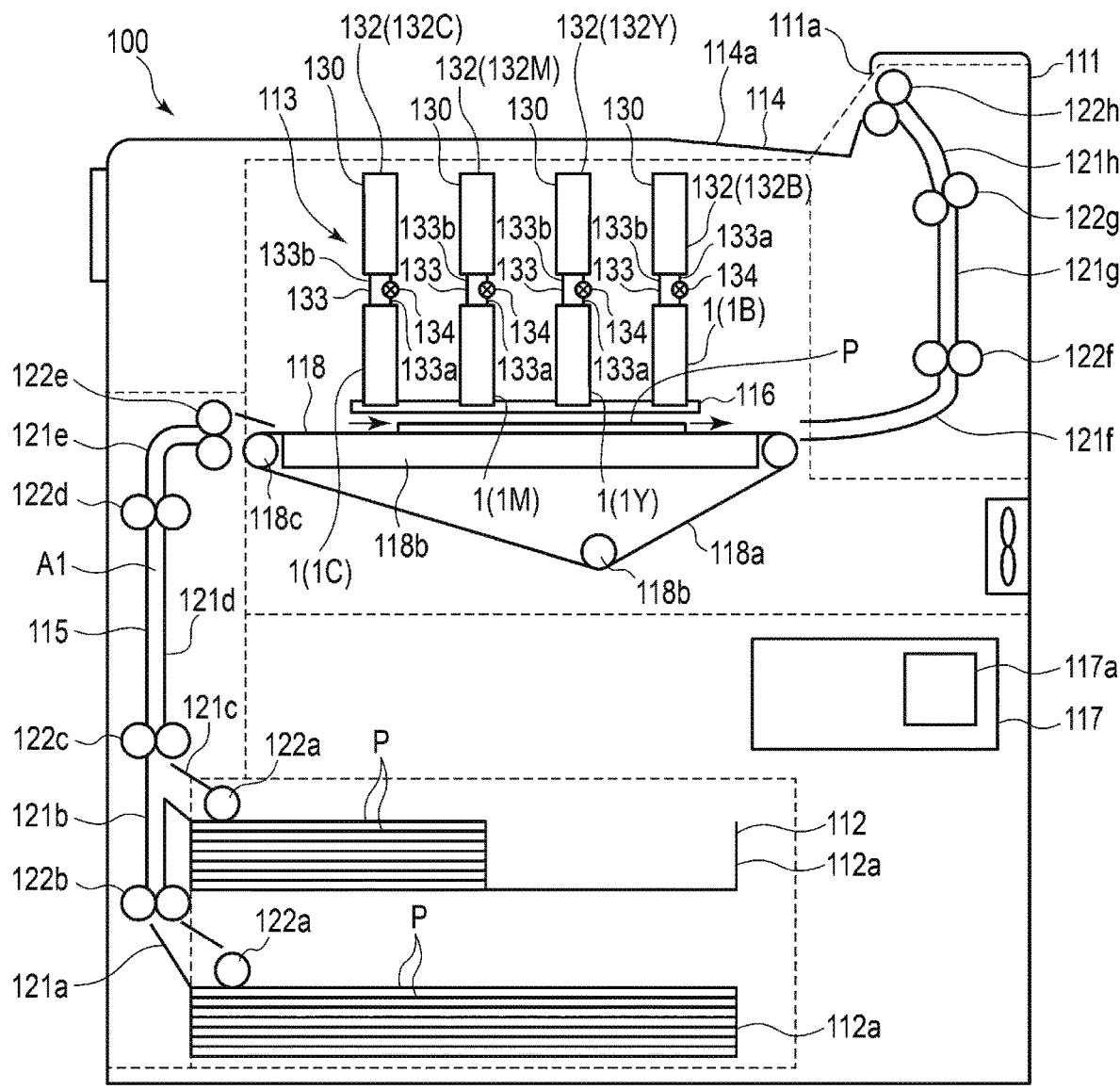
FIG. 10 illustrates an entire configuration of an ink jet apparatus according to an embodiment.

Hereinafter, an ink jet apparatus 100 having the ink jet head 1 will be described with reference to FIG. 10. FIG. 10 is an explanatory view illustrating the configuration of an ink jet printer as the ink jet apparatus 100. As illustrated in FIG. 10, the ink jet apparatus 100 includes a housing 111, a sheet supply unit 112, an image forming unit 113, a sheet discharge unit 114, a conveyance device 115 which is a support device, a maintenance device 116, and a control unit 117.

The ink jet apparatus 100 is an ink jet printer that performs image forming on a sheet P by discharging a liquid, such as ink, on the sheet P as it moves along a conveyance path A1 from the sheet supply unit 112 to the sheet discharge unit 114 through the image forming unit 113.

The sheet supply unit 112 includes a plurality of sheet feeding cassettes 112a. The sheet discharge unit 114 includes a sheet discharge tray 114a. The image forming unit 113 includes a support unit 118 that supports a sheet, and a plurality of head units 130 disposed to face the upper side of the support unit 118.

The support unit 118 includes a conveying belt 118a provided to have a loop shape in a predetermined region for performing image formation, a support plate 118b supporting the conveying belt 118a from the back side, and a plurality of belt rollers 118c provided on the back side of the conveying belt 118a.

The head unit 130 includes a plurality of ink jet heads 1, a plurality of supply tanks 132 respectively mounted on each of the ink jet heads 1, a connection flow path 133 for connecting the ink jet head 1 and the supply tank 132, and a circulation pump 134. The head unit 130 is a circulation type head unit through which circulates the liquid ink.

In the present embodiment, as the ink jet heads 1, ink jet heads 1C, 1M, 1Y, 1B of four colors of cyan, magenta, yellow, and black are provided, and as the supply tanks 132, supply tanks 132C, 132M, 132Y, and 132B, which respectively contain of each of these colors, are provided. The supply tank 132 is connected to the ink jet head 1 by the connection flow path 133. The connection flow path 133 includes a supply flow path 133a connected to the supply pipe 27 of the ink jet head 1 and a recovery flow path 133b connected to the recovery pipe 28 of the ink jet head 1.

A negative pressure control device such as a pump is connected to the supply tank 132. The negative pressure control device performs control to make the pressure inside the supply tank 132 a negative pressure with a hydraulic head difference between the ink jet head 1 and the supply tank 132, and thus the ink supplied to each nozzle of the ink jet head 1 is formed into a meniscus of a predetermined shape.

The circulation pump 134 is a liquid supply pump constituted of, for example, a piezoelectric pump. The circulation pump 134 is provided in the supply flow path 133a. The circulation pump 134 is connected to the control unit 17 by wiring, and can be controlled by a central processing unit (CPU) 117a. The circulation pump 134 circulates ink in a circulation flow path which includes the ink jet head 1 and the supply tank 132.

The conveyance device 115 conveys the sheet P along the conveyance path A1 from the sheet feed cassette 112a of the sheet supply unit 112 to the sheet discharge tray 114a of the sheet discharge unit 114 through the image forming unit 113. The conveyance device 115 includes a plurality of guide plate pairs 121a to 121h arranged along the conveyance path A1 and a plurality of conveyance rollers 122a to 122h. The conveyance device 115 supports the sheet P to be movable relative to the ink het head 1.

The maintenance device 116 includes, for example, a wiping device 116a including a blade-like wiping member 116d that wipes liquid droplets from the discharge surface 10a by moving the member while it contacts/abuts the discharge surface 10a, a suction device 116b that suctions liquid droplets from the discharge surface 10a, and a moving device 116c. The maintenance device 116 is configured to be able to reciprocate or translate between a maintenance position below and opposite the discharge surface 10a and a standby position at which it is retracted rather than immediately below the ink jet head 1.

The control unit 117 includes a processor 117a, a memory which stores various programs and the like, and an interface unit which performs inputting and outputting of data from and to the outside. For example, various control programs and operation conditions are stored in the memory as information necessary for control of an ink circulation operation, an ink supply operation, pressure regulation, temperature control, ink level management, and the like.

The conveyance device 115 moves a sheet relative to the ink jet head 1. For example, the conveyance device 115 includes a sheet moving mechanism such as rollers or belts that hold and convey a sheet. The conveyance device 115 also includes a head moving mechanism that moves the ink jet head 1 according to various printing conditions.

An operation of the ink jet apparatus 1 configured as described above will be described. When the processor 117a detects a printing instruction issued, for example, in an interface, the processor drives the conveyance device 15 to convey the sheet P and output a printing signal to the ink jet head 1 so as to drive the ink jet head 1. The ink jet head 1 performs a discharge operation to discharge ink from the nozzles 12a by selectively driving piezoelectric elements according to an image signal corresponding to image data, thus forming an image on the sheet held opposite the ink jet head. Here, the ink reaches the plurality of pressure chambers 11a from a supply tank 132 via the supply pipe 27 and the ink flow path of the flow path base 20, and is discharged from the nozzles 12a arranged to face the pressure chambers 11a. The undischarged ink is returned from the pressure chambers 11a to the supply tank 132 via the common chamber 23 and the recovery pipe 28 and can be recirculated.

The processor 117a drives the moving device 116c of the maintenance device 116 at a predetermined timing to move the maintenance device 116 to the maintenance position, and also drives the wiping device 116a and the suction device 116b to perform cleaning. Specifically, for example, the blade-like wiping member 116d of the wiping device 116a is moved along the surface direction of the discharge surface 10a while abutting on the discharge surface 10a to remove the liquid droplets attached to the discharge surface 10a. The suction nozzle of the suction device 116b is made to face the discharge surface 10a to perform suctioning.

According to the ink jet head 1 and the ink jet apparatus 100 according to the above-described embodiment, because the recess portion 33 is formed in the mask plate 30 the unevenness or step difference on the surface by the mask plate 30 is reduced since the mounting part 16 and the adhesive layer 55 can be at least partially accommodated within the recess portion. As such, flattening on the discharge surface side of the ink jet head 1 can be achieved. Accordingly, the dimension t1 of the step difference (see FIG. 5) can be reduced. Therefore, the wiping member 116d more easily abuts the discharge surface 10a, and wiping maintenance can be more effectively performed.

Furthermore, since the gap between the discharge surface 10a and the facing portion of the mask plate 30 is reduced, the adhesive layer 55 can be thinned and the amount of adhesive used in manufacturing can be reduced.

Since a portion of the bonding area of the adhesive layer 55 can be provided by the step change of the recess portion 33, the sealing performance is improved. Since the adhesive layer 55 is partially accommodated in the recess portion 33, the adhesive layer 55 is less likely to protrude beyond the outer edge of the mask plate 30.

According to the above-described embodiment, a maintenance or cleaning process on the discharge surface 10a can be more effectively performed.

The possible embodiments of the present disclosure is not limited to the above-described example embodiment.

For example, in the above example embodiment, the mask plate 30 is disposed in the region which is to one side of the discharge surface 10a and extends over the entire length along the first direction, but in other examples, a mask plate 30 may be provided on both sides of the discharge surface 10a or along the entire circumference of the drive base 10. Alternatively, the mask plate 30 may be provided only along a portion of the discharge surface 10a rather than the entire length along the first direction.

Figure 11:
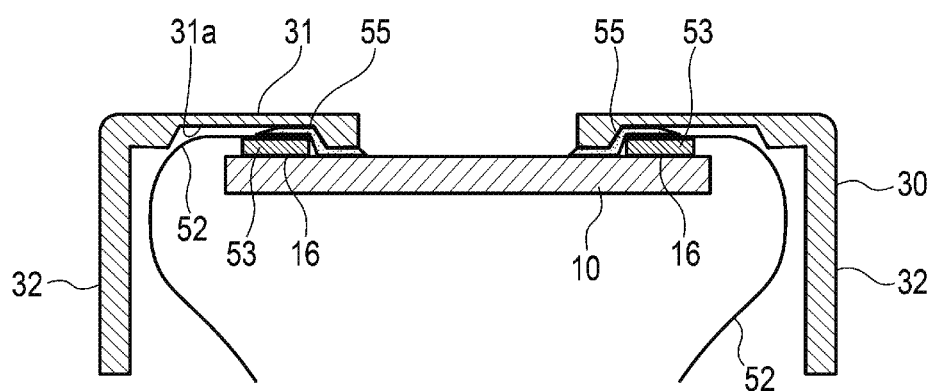
FIG. 11 illustrates a cross-sectional view of a part of an ink jet head according to another embodiment.
Figure 12:
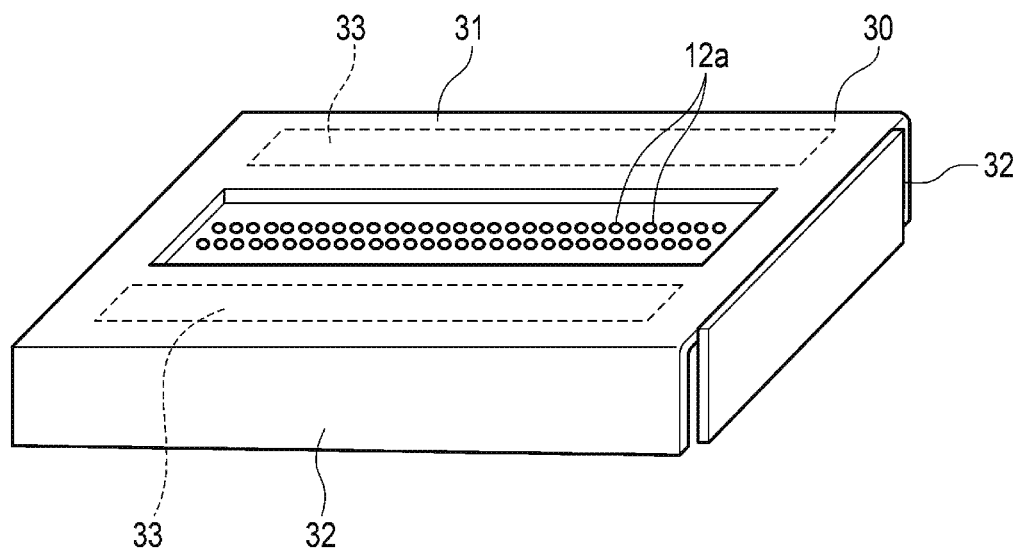
FIG. 12 illustrates a perspective view of a part of an ink jet head according to another embodiment.

In an ink jet head 1A illustrated in FIGS. 11 and 12 is another example embodiment, the mask plate 30 is on the entire outer perimeter of the discharge surface 10a. The mask plate 30 includes a top plate portion 31 that surrounds the entire circumference of the discharge surface 10a, two side plates 32 arranged on opposite sides of the drive base 10, and a central opening through which the nozzles 12a are exposed. In the ink jet head 1A, two mounting parts 16 (in which the electrodes 16a are formed) are respectively provided on both sides of the row of the nozzles 12a. Recessed portions 33 are formed in the top plate portion 31 corresponding to the mounting parts 16 on both sides. In the present embodiment, the same effect as that of the first embodiment can also be obtained.

In the above-described example embodiments, the mask plate 30 has an L-shaped bent structure, but the present disclosure is not limited thereto. For example, the side plate portion 32 may not be provided in all examples, and the mask plate 30 may be formed as only the plate-like top plate portion 31 facing the discharge surface 10a.

The positioning of the recess portion 33 is not limited to the above examples, and the recess portion 33 can be appropriately positioned or shaped according to factors such as the shape of the mounting part and the bonding part. For example, a plurality of recess portions 33 may be formed when the mounting part 16 is provided at a plurality of locations or the like.

A coating layer such as an ink repellent layer may be further formed on the discharge surface 10a.

The liquid to be discharged is not limited to ink, and, in general, any liquid can be discharged. As a liquid discharge device that discharges a liquid other than ink, for example, a device for discharging a liquid containing conductive particles to be used for forming a wiring pattern of a printed circuit board or the like may be used.

The ink jet head 1 may have a structure in which ink droplets are discharged by deforming a vibration plate with electricity or a structure in which ink droplets are discharged from nozzles using thermal energy of a heater or the like.

In the above-described embodiment, the liquid discharge apparatus is described as an example used for an ink jet apparatus, but the present disclosure is not limited thereto. For example, the liquid discharge apparatus can be used as a 3D printer, industrial manufacturing machines, medical applications.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid discharge head, comprising:
    a drive base including:
        an array of nozzles on a surface of the drive base;
        a plurality of actuators corresponding to the array of nozzles; and
        a plurality of electrodes on the surface of the drive base and electrically connected to the plurality of actuators;
    a flexible wiring substrate electrically connected to the plurality of electrodes; and
    a mask plate covering a portion of the surface of the drive base, the plurality of electrodes, and an end portion of the flexible substrate, the mask plate including a recess portion facing the surface of the drive base, the end portion of the flexible substrate being within the recess portion of the mask plate.

2. The liquid discharge head according to claim 1, further comprising:
    an adhesive layer between the surface of the drive base and the mask plate and between the end portion of the flexible substrate and the mask plate.

3. The liquid discharge head according to claim 1, wherein the end portion of the flexible substrate is connected to the plurality of electrodes by an anisotropic conductive film between the surface of the drive base and the flexible substrate.

4. The liquid discharge head according to claim 1, wherein a depth of the recess portion in a thickness direction of the mask plate is less than ⅘ of a thickness of the mask plate.

5. The liquid discharge head according to claim 1, wherein the mask plate is metal.

6. The liquid discharge head according to claim 1, wherein the mask plate includes a first portion parallel to the surface of the drive base and including the recess portion therein, and a second portion extending from the first portion and facing a side surface of the drive base.

7. The liquid discharge head according to claim 1, wherein the flexible wiring substrate is connected to a drive IC for driving the plurality of actuators.

8. The liquid discharge head according to claim 1, wherein the mask plate covers an entire outer circumference of the surface of the drive base.

9. The liquid discharge head according to claim 1, wherein each of the plurality of actuators is a piezoelectric element.

10. A liquid discharge head, comprising:
    a drive base including:
        an array of nozzles on a surface of the drive base;
        a plurality of actuators corresponding to the array of nozzles;
        a first plurality of electrodes on a first side of the array of nozzles on the surface of the drive base and electrically connected to a first subset of the plurality of actuators; and
        a second plurality of electrodes on a second side of the array of nozzles on the surface of the drive base and electrically connected to a second subset of the plurality of actuators;
    a first flexible wiring substrate having an end portion connected to the first plurality of electrodes;
    a second flexible wiring substrate having an end portion connected to the second plurality of electrodes; and
    a mask plate covering a portion of the surface of the drive base, the first plurality of electrodes, the end portion of the first flexible wiring substrate, the second plurality of electrodes, and the end portion of the second flexible wiring substrate, the mask plate including a first recess portion on a first inner surface portion facing the first plurality of electrodes and a second recess portion on a second inner surface portion facing the second plurality of electrodes, wherein
    the end portion of the first flexible wiring substrate is within the first recess portion of the mask plate, and
    the end portion of the second flexible wiring substrate is within the second recess portion of the mask plate.

11. The liquid discharge head according to claim 10, further comprising:
    a first adhesive layer between the surface of the drive base and the first inner surface portion of the mask plate and between the end portion of the first flexible wiring substrate and the first inner surface portion of the mask plate; and a second adhesive layer between the surface of the drive base and the second inner surface portion of the mask plate and between of the end portion of the second flexible wiring substrate and the second inner surface portion of the mask plate.

12. The liquid discharge head according to claim 10, wherein the end portion of the first flexible substrate is connected to the first subset of the plurality of electrodes by a first anisotropic conductive film between the surface of the drive base and the first flexible substrate, and the end portion of the second flexible substrate is connected to the second subset of the plurality of electrodes by a second anisotropic conductive film between the surface of the drive base and the second flexible substrate.

13. The liquid discharge head according to claim 10, wherein a depth of the first recess portion in the mask plate in a thickness direction of the mask plate is less than 4/5 of a thickness of the mask plate; and a depth of the second recess portion in the mask plate in the thickness direction of the mask plate is less than 4/5 of the thickness of the mask plate.

14. A liquid discharge apparatus, comprising:
a liquid discharge head comprising:
a drive base including:
an array of nozzles on a surface of the drive base;
a plurality of actuators corresponding to the array of nozzles; and
a plurality of electrodes on the surface of the drive base and electrically connected to the plurality of actuators;
a flexible wiring substrate electrically connected to the plurality of electrodes;
a mask plate covering a portion of the surface of the drive base, the plurality of electrodes and an end portion of the flexible substrate, the mask plate including a recess portion facing the surface of the drive base, the end portion of the flexible substrate being within the recess portion of the mask plate; and
a wiping member that contacts the surface of the drive base during a cleaning process.

15. The liquid discharge apparatus according to claim 14, wherein the wiping member is configured to move along the surface of the drive base during the cleaning process.

16. The liquid discharge apparatus according to claim 14, further comprising:
a sheet conveyer configured to convey a sheet to a position facing the surface of the drive base.

17. The liquid discharge head according to claim 1, wherein a bottom surface of the recess portion is in parallel to the surface of the drive base.

18. The liquid discharge head according to claim 10, wherein a bottom surface of the first recess portion is in parallel to the surface of the drive base, and a bottom surface of the second recess portion is in parallel to the surface of the drive base.

* * * * *